United States Patent [19]

Numata

[11] Patent Number: 5,510,293

[45] Date of Patent: *Apr. 23, 1996

[54] METHOD OF MAKING RELIABLE METAL LEADS IN HIGH SPEED LSI SEMICONDUCTORS USING THERMOCONDUCTIVE LAYERS

[75] Inventor: Ken Numata, Dallas, Tex.

[73] Assignee: Texas Instruments Incorporated, Dallas, Tex.

[ * ] Notice: The portion of the term of this patent shall not extend beyond the expiration date of Pat. No. 5,476,817.

[21] Appl. No.: 251,822

[22] Filed: May 31, 1994

[51] Int. Cl.$^6$ .................................................. H01L 21/44
[52] U.S. Cl. ............................................ 437/195; 437/190
[58] Field of Search .................................... 437/190, 195

[56] References Cited

U.S. PATENT DOCUMENTS

| | | | |
|---|---|---|---|
| 4,987,101 | 1/1991 | Kaanta et al. | 437/228 |
| 5,103,288 | 4/1992 | Sakamoto et al. | 357/71 |
| 5,155,576 | 10/1992 | Mizushima | 357/71 |
| 5,324,683 | 6/1994 | Fitch et al. | 437/65 |

OTHER PUBLICATIONS

Wolf et al., vol. I, Silicon Processing For The VLSI Era, Lattice Press, 1986, pp. 191–195, 539–556, 568–571.

Wolf et al., vol. II, Silicon Processing for the VLSI Era, Lattice press, 1990 pp. 194–200.

Takashi Fukada and Takashi Akahori, "Preparation of SiOF Films with Low Dielectric Constant by ECR Plasma Chemical Vapor Deposition", International Conference on Solid State Devices and Materials, 1993, pp. 158–160.

P. Bruesch, F. Stucki, Th. Baumann, P. Kluge–Weiss, B. Bruhl, L. Niemeyer, R. Strumpler, B. Ziegler, M. Mielke, "Electrical and Infrared Dielectrical Properties of Silica Aerogel and of Silica–Aerogels–Based Composites", Appl. Phys. A 57, 1993, pp. 329–337.

Shinichi Ito and Yoshio Homma, "Application of Surface Reformed Thick Spin–on–Glass to MOS Device Planarization", Electrochem. Soc., vol. 137, No. 4, Apr. 1990, pp. 1213–1218.

"Chronological Scientific Tables" Ed. Tokyo Astronomical Observatory, Published by Maruzen, Tokyo (1986).

K. E. Goodson, M. I. Flik, L. T. Su, and Dimitri A. Antoniadis, Fellow, IEEE, "Annealing–Temperature Dependence of the Thermal Conductivity of LPCVD Silicon––Dioxide Layers", IEEE Device Letters, vol. 14, No. 10, Oct., 1993, pp.490–492.

E. U. Condon, Ph.D., "Heat and Thermodynamics", Handbook of Physics, Second Edition.

Katsuyuki Musaka, Shinsuke Mizuno, Kiyoaki Hara, "Single Step Gap Filling Technology For Subhalf Micron Metal Spacings on Plasma Enhanced TEOS/$O_2$ Chemical Vapor Deposition System", Applied Materials Japan Inc. Technology Center, pp. 510–512.

Takashi USAMI, Kimiaki Shimokawa and Masaki Yoshimaru, "Low Dielectric Constatn Interlayer Using Flouride Doped Silicon Oxide", 1993 Internation Conference on Solid State Devices and Materials, Makuhari, pp. 161–163.

*Primary Examiner*—Brian E. Hearn
*Assistant Examiner*—Lynne A. Gurley
*Attorney, Agent, or Firm*—Kay Houston; James W. Brady; Richard L. Donaldson

[57] ABSTRACT

A method for manufacturing semiconductor device having metal leads 14 with improved reliability, and device for same, including metal leads 14 on a substrate 12, a low-dielectric constant material 18 at least between the metal leads 14, and thermoconductive insulating layer 22 deposited on the metal leads 14 and the low-dielectric constant material 18. Heat from the metal leads 14 is transferable to the thermoconductive insulating layer 22, and the thermoconductive insulating layer 22 is capable of dissipating the heat. The low-dielectric constant material 18 has a dielectric constant of less than 3.5. An advantage of the invention is to improve reliability of metal leads for circuits using low-dielectric constant materials.

14 Claims, 3 Drawing Sheets

METHOD OF MAKING RELIABLE METAL LEADS IN HIGH SPEED LSI SEMICONDUCTORS USING THERMOCONDUCTIVE LAYERS

FIELD OF THE INVENTION

This invention relates generally to the fabrication of semiconductor devices, and more specifically to semiconductors with submicron spacing and low-dielectric constant materials between the intermetallic leads.

BACKGROUND OF THE INVENTION

Semiconductors are widely used in integrated circuits for electronic applications, including radios and televisions. Such integrated circuits typically use multiple transistors fabricated in single crystal silicon. Many integrated circuits now contain multiple levels of metallization for interconnections.

Semiconductor devices are being scaled in the horizontal dimension to reduce wafer cost by obtaining more chips per wafer or by increasing circuit complexity by obtaining more transistors per chip. Although semiconductor devices are being scaled in the horizontal dimension, semiconductor devices are not generally being scaled in the vertical dimension (because the current density would exceed reliability limits). Thus, conductors may have a high aspect ratio (ratio of conductor height to conductor width of greater than one). With horizontal scaling, these tall metal leads are being packed closer and closer together, causing capacitive coupling: between the leads to become the primary limitation to circuit speed. If line-to-line capacitance is high, a likelihood for electrical inefficiencies and inaccuracies exist. Reducing ate capacitance within these multi-level metallization systems will reduce the RC time constant between the lines.

Typically, the material used to isolate metal lines from each other is silicon dioxide. However, the dielectric constant of dense silicon oxide grown by thermal oxidation or chemical vapor deposition is on the order of 3.9. The dielectric constant is based on a scale where 1.0 represents the dielectric constant of a vacuum. Various materials exhibit dielectric constants from very near 1.0 to values in the hundreds. As used herein, the term low-dielectric will refer to a material with a dielectric constant of less than 3.5.

SUMMARY OF THE INVENTION

Recently, attempts have been made to use low-dielectric constant materials to replace silicon dioxide as a dielectric material. The use of low-dielectric constant materials as insulating layers reduces the capacitance between the lines (or leads), thus reducing the RC time constant. An apparently heretofore-unrecognized problem is that, especially in high aspect ratio metal leads, the decreased thermal conductivity of low-dielectric constant materials may result in metal lead breakage due to the effects of Joule's heat. The present invention solves this problem by improving the thermal conductivity of the structure, resulting in improved reliability of metal leads in structures using low-dielectric construct materials.

The invention encompasses a method for manufacturing semiconductor device:s having metal leads with improved reliability, and a device for same, comprising metal leads on a substrate, a low-dielectric constant material between the metal leads, and a thermoconductive insulating layer on the metal leads and low-dielectric constant material. Heat from the metal leads is transferable to the thermoconductive insulating layer, and the thermoconductive insulating layer is capable of dissipating the heat. The low-dielectric constant material has a dielectric constant of less than 3.5. An advantage of the invention is to improve reliability of metal leads for circuits using low-dielectric constant materials.

One preferred embodiment of the invention involves depositing a metal interconnect layer on a substrate and etching the metal interconnect layer in a predetermined pattern to form metal leads. A low-dielectric constant material is deposited between the metal leads. Then, a thermoconductive insulating layer (a layer having a thermoconductivity at least 20% higher than the thermal conductivity of the low-dielectric constant material and preferably 20% larger than $SiO_2$) is deposited over the metal leads and the low-dielectric constant material.

Another embodiment involves depositing a metal interconnect layer on a substrate and etching the metal interconnect layer in a predetermined pattern to form metal leads. A thin thermoconductive layer (an insulative material with a thermal conductivity at least 20% larger than the thermal conductivity of the low-dielectric constant material and preferably 20% larger than $Si_3N_4$) is deposited over the substrate and the metal leads. Then a low-dielectric constant material is deposited between the metal leads and the dummy leads, over the thin thermoconductive layer. The low-dielectric constant material is removed from the tops of the metal leads, exposing the thin thermoconductive layer. A thermoconductive insulating layer is deposited Over the metal leads and the low-dielectric constant material. Heat from the metal leads is transferable through the thin thermoconductive layer to the thermoconductive insulating layer, where it may be dissipated.

An advantage of the invention is to improve reliability of metal leads for circuits using low-dielectric constant materials. The invention is particularly beneficial to semiconductors having a combination of metal, leads with high aspect ratios and low-dielectric constant materials which ate more thermally insulating.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

DETAILED DESCRIPTION OF PREFERRED EMBODIMENTS

Figures 1A, 1B, 1C:
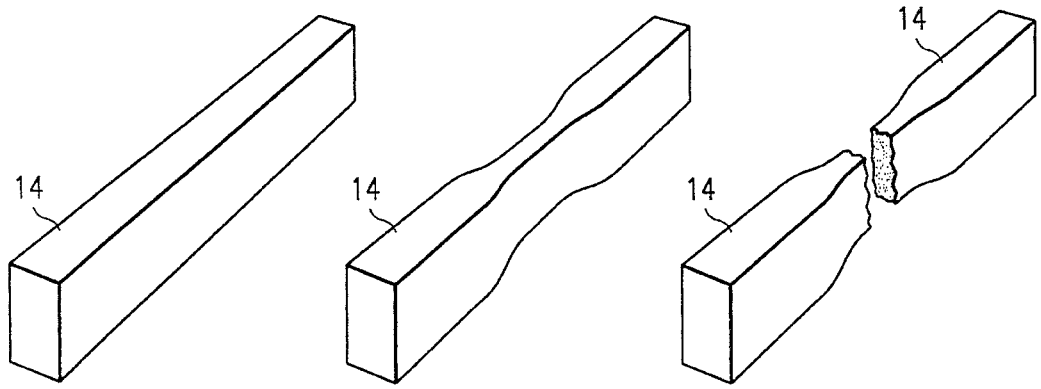
FIGS. 1A–1C are three-dimensional views of a metal lead of a semiconductor wafer, showing the negative effects of Joule's heat.

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of several preferred embodiments and alternative embodiments, including manufacturing methods. Corresponding numerals and symbols in the different figures refer to corresponding parts unless otherwise indicated. Table 1 below provides an overview of the elements of the embodiments and the drawings.

TABLE 1

| Drawing Element | Preferred or Specific Examples | Generic Term | Other Alternate Examples or Descriptions |
|---|---|---|---|
| 10 | | Semiconductor wafer | |
| 12 | Silicon | Substrate | May be other metal interconnect layers or semiconductor elements, (e.g. transistors, diodes); oxides; Compound semiconductors (e.g. GaAs, InP, Si/Ge, SiC). |
| 14 | Aluminum alloy | Metal leads | Titanium trilayer (TiN/AlCu/TiN); Alloys of Cu, Mo, W, Ti, Si; Polysilicon, silicides, nitrides, carbides; AlCu alloy with Ti or TiN underlayers; Metal interconnect layer. |
| 18 | OSOG (organic spin-on glass) | Low-dielectric constant material | Air gap (also inert gases, vacuum); silica aerogel; other aerogels or xerogels; fluorinated silicon oxide. |
| 22 | AlN | Thermo-conductive insulating layer | $Si_3N_4$; both AlN and $Si_3N_4$ (e.g. bilayer or trilayer of $Si_3N_4$/AlN/$Si_3N_4$); Insulative material with a thermal conductivity 20% larger than the thermal conductivity of low-dielectric constant material 18 and preferably 20% larger than $SiO_2$; annealed $SiO_2$ |
| 24 | AlN | Thin thermo-conductive layer | Insulative material with a thermal conductivity 20% larger than the thermal conductivity of low-dielectric constant material 18 and preferably 20% larger than $Si_3N_4$. |

An apparently heretofore-unrecognized problem is that the decreased thermal conductivity of low-dielectric constant materials may result in metal lead breakage due to the effects of Joule's heat, especially in high aspect ratio conductors with low-dielectric constant material between conductors, where the low-dielectric constant material is on more than half the conductor perimeter. Since all metals have a certain amount of resistance, the temperature of a metal rises as a current passes through it. Such heat through a metal lead is known as Joule's heat. As a metal lead heats locally in one portion along it, the resistance in that portion rises slightly (due to properties of the metal), causing the temperature in that portion to rise even more (although slightly). Thus, locally heated metal leads can be damaged or fractured. The thinner the metal lead, the weaker it is (which is particularly a concern in submicron circuits). The use of low-dielectric constant materials as insulative layers further present a problem, for such materials generally have poor thermoconductivity. With the use of low-dielectric constant materials, much more of the Joule's heat generated in metal leads of a circuit remains concentrated in the lead itself.

The effect of Joule's heat on a metal lead is shown in FIG. 1. FIG. 1A shows a metal lead 14 of a semiconductor wafer (other portions of the wafer are not shown). The cross-section of the lead is typically rectangular-shaped, with the height being greater than the width, because of scale-down. The metal lead has been scaled in the lateral direction, but scale-down in the vertical direction is limited by electrical conductivity requirements of the circuit. When current flows through metal lead 14, the metal lead is heated. In reality, a metal lead has thin and fragile portions. Such unevenness cannot be avoided because photolithography and etching processes of metal leads are not ideal. Electromigration, intensified by Joule's heat, causes the metal lead to first weaken, and then thin. The thin and fragile portions of the metal lead becomes thinner and thinner as current is cycled through the metal lead (FIG. 1B), and electromigration is even further intensified in this portion. Eventually such leads can break, as shown in FIG. 1C, resulting in device failures.

Due to the rectangular cross-sectional shape of the metal leads and the likelihood of leads in an adjacent layer being perpendicular, the parasitic capacitance in the vertical direction (from layer to layer) in multilevel metal interconnect schemes is less of a concern than in the lateral direction. Parasitic capacitance can be excessive between leads in the same metal plane if measures are not taken to reduce the capacitance. The distances from other metal planes are usually large enough so capacitance is not a concern in the vertical direction. Additionally, the top piece of a metal lead is smaller than the side face, because of the rectangular shape, resulting in a smaller relevant electrode area for parasitic capacitance in the vertical direction.

The present invention, therefore, is based on the novel principle of using high thermoconductivity materials as insulators between metal layers, even if dielectric properties must be sacrificed.

Figure 2:
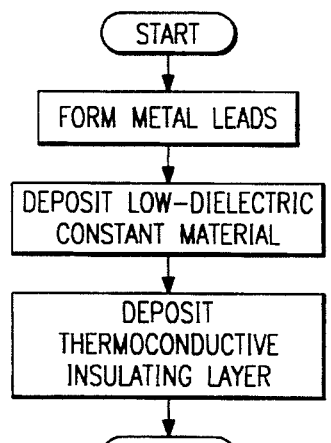
FIG. 2 is a flow chart for the first and second embodiments of the present invention.

The present invention improves reliability of metal leads in structures using low-dielectric constant materials by using a thermoconductive insulating layer to improve the thermal conductivity of the structure. FIG. 2 is a flow chart of the typical steps of the present invention. Metal leads are formed, a low-dielectric constant material is deposited between the metal leads, and then a thermoconductive insulating layer is deposited over the metal leads. The thermoconductive insulating layer diffuses the heat away from the lead, reducing the negative effects of Joule's heat.

Figure 3A:
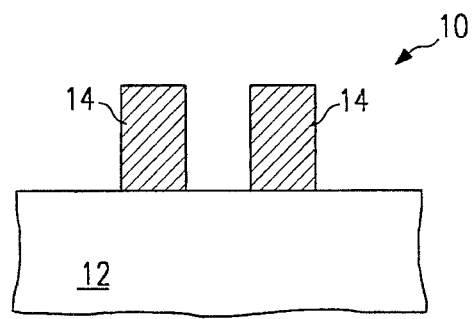
FIGS. 3A–3C are cross-sectional views of a first embodiment of the present invention, showing a thermoconductive insulating layer formed on a semiconductor wafer.

FIG. 3A shows a cross-sectional view of a semiconductor wafer 10 having metal leads 14 formed on a substrate 12. The substrate may, for example, contain transistors, diodes, and other semiconductor elements (not shown) as are well known in the art. The substrate 12 may also contain other metal interconnect layers, and typically contains a top insulating oxide layer (to prevent leads from shorting to each other in subsequent metal layers). A metal interconnect layer has been deposited over the substrate 11. The metal interconnect layer may comprise, for example, aluminum or a titanium-tungsten/aluminum bilayer. The metal interconnect layer is etched with a predetermined pattern to form etch lines, or metal leads 14. Some of the metal leads 14 may be in close proximity to each other, for example, 1 μm or less apart.

Figure 3B:
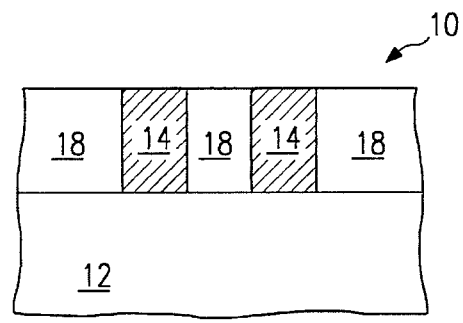
Figure 3C:
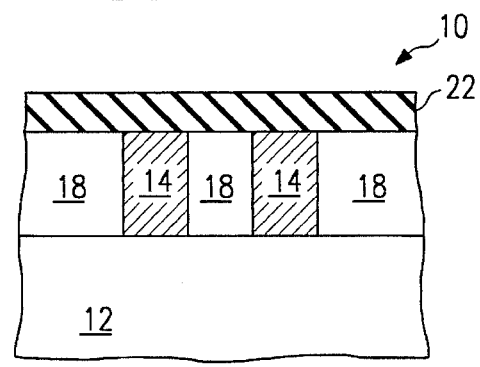

A low-dielectric constant material 18, preferably a silica aerogel, air gap, or organic spin-on glass (OSOG), is formed or deposited between the metal leads 14, as shown in FIG. 3B. Thermoconductive insulating layer 22 is deposited over metal leads 14 and the low-dielectric constant material 18, as shown in FIG. 3C. Thermoconductive insulating layer 22 is preferably comprised of AlN, but may also be other insulative materials having a thermal conductivity at least 20% larger than the thermal conductivity of low-dielectric constant material 18 and preferably 20% larger than $SiO_2$ (e.g. trilayer of $Si_3N_4/AlN/Si_3N_4$).

The thermoconductive insulating layer 22 diffuses some of the Joule's heat away from the metal leads 14 when the device is in operation. The thermoconductive insulating layer 22 preferably is in direct contact with the metal leads 14 over their entire length.

Figure 4A:
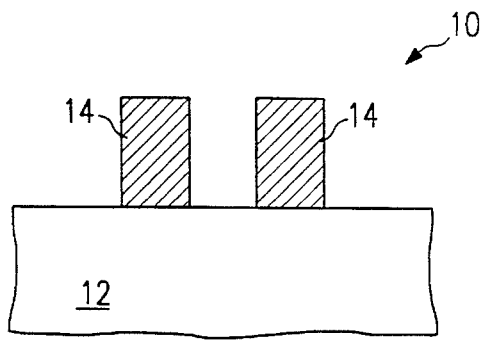
FIGS. 4A–4D are cross-sectional views of a second embodiment.
Figure 4B:
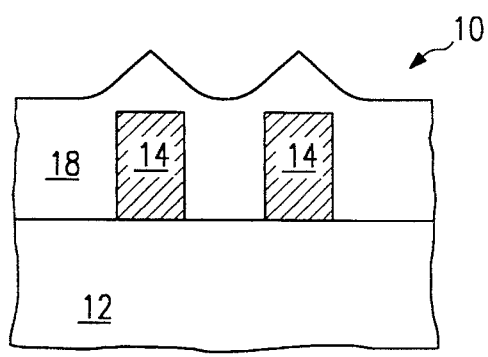
Figure 4C:
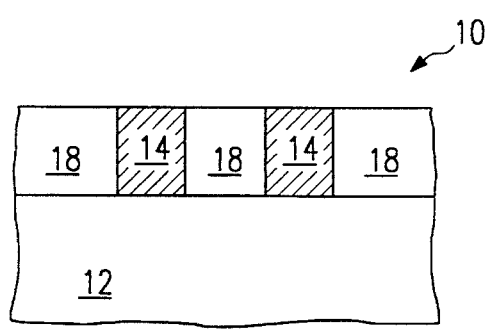
Figure 4D:
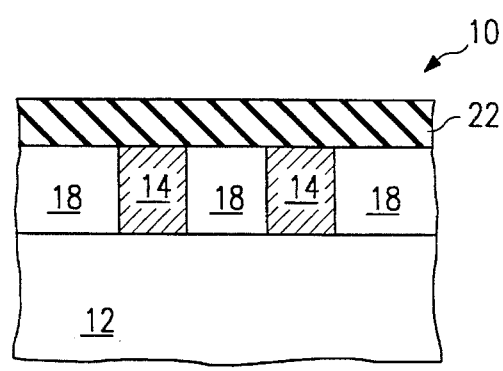

A second embodiment of the present invention is shown in FIGS. 4A–4D, where the low-dielectric constant material 18 is deposited and then etched back to expose the tops of metal leads 14. In this example, the low-dielectric material 18 is comprised of fluorinated silicon oxide which has been deposited by an ECR (electron cyclotron resonance) CVD (chemical vapor deposition). The fluorinated silicon oxide may forms peaks over metal leads 14 when applied, as shown in FIG. 4B. The low-dielectric constant material 18 is planarized, preferably by CMP (chemical-mechanical polishing) to expose the tops of metal leads 14 (FIG. 4C). Thermoconductive insulating layer 22 is then deposited over the metal leads 14 and the low-dielectric constant material 18 (FIG. 4D).

Figure 5:
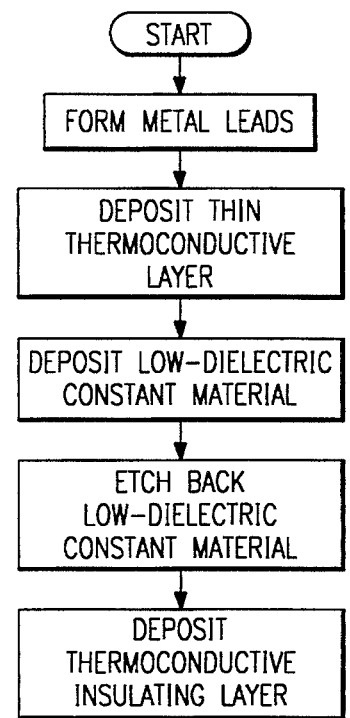
FIG. 5 is a flow chart for a third embodiment.

FIG. 5 is a flow chart showing steps of a third embodiment of the present invention. Metal leads are formed, and a thin thermoconductive layer is deposited over the metal leads and possibly exposed portions of the substrate. Low-dielectric constant material is deposited over the thin thermoconductive layer. The low-dielectric constant material is etched-back to expose at least the thin thermoconductive layer on the tops of the metal leads. A thermoconductive insulating layer is deposited over the tops of the metal leads and the low-dielectric constant material.

Figure 6A:
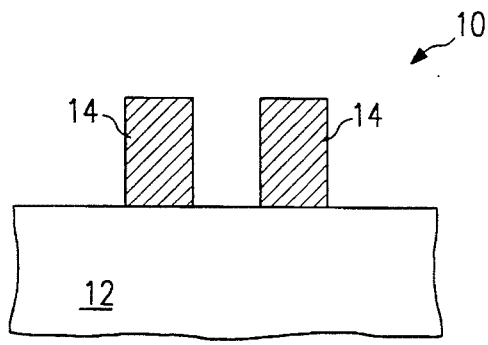
FIGS. 6A–6E are cross-sectional views of the third embodiment of the present invention, showing a thin thermoconductive layer formed on the metal leads.
Figure 6B:
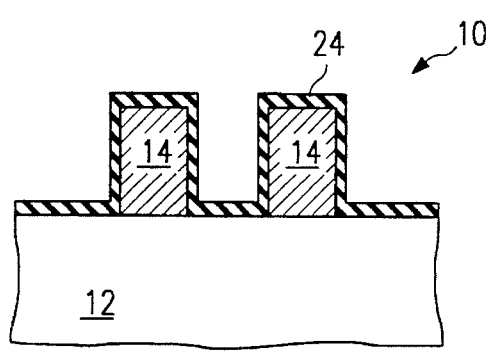
Figure 6C:
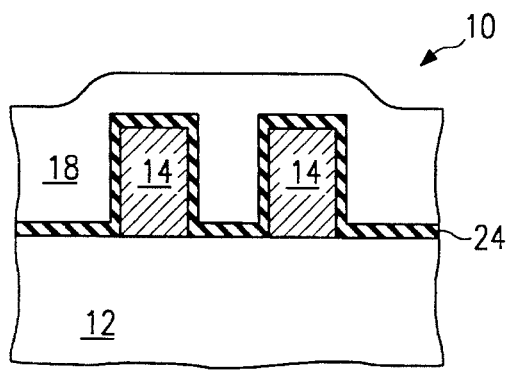
Figure 6D:
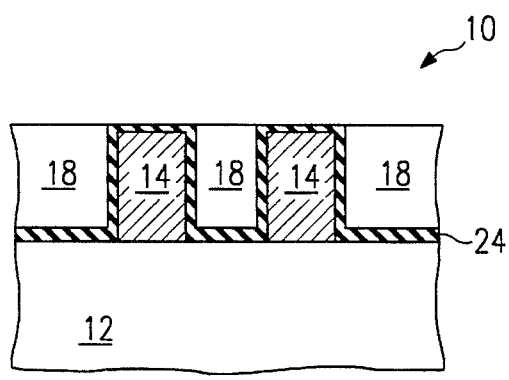
Figure 6E:
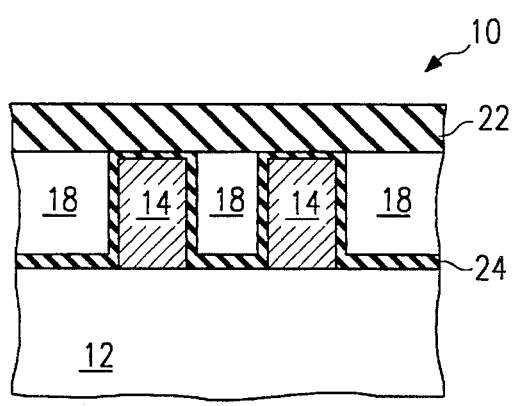

In the third embodiment, semiconductor wafer 10 comprises a substrate 12, upon which metal leads 14 are formed (FIG. 6A). Portions of the substrate 12 remain exposed, between metal leads 14. A thin thermoconductive layer 24 is applied on the exposed portions of the substrate 12 and on the metal leads 14 (FIG. 6B). A low-dielectric constant material 18 is deposited over the thin thermoconductive layer 24, preferably to a height above the thin thermoconductive layer 24 on the tops of the metal leads 14 (FIG. 6C). Low-dielectric constant material 18 may be, for example, silica aerogel comprising a sol-gel derived $SiO_2$, consisting of nanometer scaled microparticles connected among each other. Silica aerogel is typically very porous, and has negligible thermal conductivity. The aerogel is etched back (planarized), e.g. with CMP (chemical-mechanical polishing), to expose the thin thermoconductive layer 24 on tops of the metal leads 14 while leaving low-dielectric constant material 18 between the metal leads 14, as shown in FIG. 6D. A top portion of the thin thermoconductive layer 24 may be removed during the etch step. Then a thermoconductive insulating layer 22 is deposited on the thin thermoconductive layer 24 on the metal leads 14, and on the low-dielectric constant material 18 (FIG. 6E). A portion of the Joule's heat from metal leads 14 is transferable through the thin thermoconductive layer 24 to thermoconductive insulating layer 22, where the heat is diffused. Subsequent processing steps may then be performed e.g. further deposition and etching of semiconductor, insulative and metallic layers.

The present invention can also be used on semiconductors using other low-dielectric constant materials, such as air gaps, xerogels, polymers, or spin-on glasses, for example. To reduce capacitive coupling between leads, low-dielectric constant materials are being investigated, such as pure polymers (e.g. parylene, teflon, polyimide) or organic spin-on glass (OSOG, e.g. silsequioxane or siloxane glass). Refer to U.S. Pat. No. 4,987,101 issued to Kaanta et al on Jan. 22, 1991 which describes a method for fabricating gas (air) dielectrics; and U.S. Pat. No. 5,103,288 issued to Sakamoto on Apr. 7. 1992 which describes a multilayered wiring structure which decreases capacitance by using a porous dielectric.

The novel method of using a thermoconductive insulating layer to dissipate heat from metal leads is beneficial to semiconductors having submicron spacing and using low-dielectric constant materials. The thermoconductive insulating layer diffuses a portion of the Joule's heat generated in the metal leads laterally throughout the thermoconductive insulating layer, thus enhancing reliability of metal leads. The invention is particularly beneficial to semiconductors having a combination of metal leads with high aspect ratios (e.g. 2 or greater) and low-dielectric constant materials (especially having a low-dielectric constant of less than 2) which are more thermally insulating.

While the invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating metal leads in a semiconductor device, said metal each being resistant to damage due to Joule's heat, said method comprising the steps of:

forming at least two metal leads on a substrate, said metal leads having a height-to-width aspect ratio greater than 2;

depositing a low-dielectric constant material at least between said metal leads, said low-dielectric constant material having a dielectric constant of less than 3.5; and depositing a thermoconductive insulating layer on at least the tops of said metal leads, said thermoconductive insulating layer comprising at least one of AlN and $Si_3N_4$;

wherein current passing through said metal leads produces said Joule's heat which is transferable to said thermoconductive insulating layer and is dissipatable.

2. The method of claim 1 wherein said thermoconductive insulating layer comprises AlN.

3. The method of claim 1 wherein the spacing between said metal leads is less than one μm.

4. The method of claim 1 wherein said thermoconductive insulating layer has a thermal conductivity greater than thermal conductivity of said low-dielectric constant material.

5. The method of claim 1 further comprising the step of depositing a thermoconductive layer on at least said metal leads, after said forming step, wherein said heat from said metal leads is transferred to said thermoconductive layer and then to said thermoconductive insulating layer.

6. The method of claim 5 further comprising the step of etching said low-dielectric constant material to expose said thermoconductive layer on said metal leads, after said depositing a low-dielectric constant material, and wherein said depositing a low-dielectric constant material is performed over at least said metal leads.

7. The method of claim 6 wherein a top portion of said thermoconductive layer is removed during said etching step.

8. The method of claim 6 wherein the spacing between said metal leads is less than one μm.

9. A method of fabricating metal leads in a semiconductor device, said metal leads being resistant to damage due to Joule's heat, said method comprising the steps of:

forming at least two metal leads on a substrate, said metal leads having a height-to-width aspect ratio greater than 2;

depositing a first thermoconductive layer on at least said metal leads;

depositing a low-dielectric constant material on said first thermoconductive layer at least between said metal leads said low-dielectric constant material having a dielectric constant of less than 3.5; and depositing a thermoconductive insulating layer on at least the tops of said metal leads, said thermoconductive insulating layer comprising AlN;

wherein current passing through said metal leads produces said Joule's heat which is transferable to said first thermoconductive layer and said thermoconductive insulating layer and is dissipatable.

10. The method of claim 9 wherein the spacing between said metal leads is less than one μm.

11. The method of claim 9 wherein said thermoconductive insulating layer has a conductivity greater than the conductivity of said low-dielectric constant material.

12. The method of claim 9 further comprising the step of etching said low-dielectric constant material to expose said first thermoconductive layer on said metal leads, after said depositing a low-dielectric constant material.

13. The method of claim 12 wherein a top portion of said first thermoconductive layer is removed during said etching step.

14. The method of claim 12 wherein the spacing between said metal leads is less than one μm.

* * * * *